United States Patent [19]

Bogar

[11] Patent Number: 4,944,651
[45] Date of Patent: Jul. 31, 1990

[54] COMPONENT CARRYING APPARATUS AND METHOD

[76] Inventor: William D. Bogar, 80 Cambridge St., Burlington, Mass. 01803

[21] Appl. No.: 696,062

[22] Filed: Jan. 29, 1985

[51] Int. Cl.⁵ .............................................. B23P 19/04
[52] U.S. Cl. ..................................... 414/787; 206/334; 414/405; 414/761; 414/786
[58] Field of Search ............... 414/787, 786, 675, 405, 414/758, 761, 762, 763; 206/334, 332, 331, 328, 329, 330; 118/500, 503; 269/900, 903

[56] References Cited

U.S. PATENT DOCUMENTS

| | | | |
|---|---|---|---|
| 2,355,643 | 8/1944 | Grover | 414/405 |
| 2,691,144 | 10/1954 | Parsons et al. | 414/405 X |
| 3,427,550 | 2/1969 | Helda et al. | 206/331 X |
| 3,518,752 | 7/1970 | Lentz | 414/405 X |
| 3,578,189 | 5/1971 | Yonkers | 414/761 X |
| 3,680,193 | 8/1972 | Scaminaci, Jr. et al. | 269/903 X |
| 3,794,327 | 2/1974 | Washington | 414/405 X |
| 3,946,864 | 3/1976 | Hutson | 206/332 |

FOREIGN PATENT DOCUMENTS

| | | | |
|---|---|---|---|
| 618523 | 4/1961 | Canada | 206/328 |
| 694715 | 9/1964 | Canada | 206/334 |
| WO1123 | 12/1979 | PCT Int'l Appl. | 206/334 |

Primary Examiner—Frank E. Werner
Attorney, Agent, or Firm—Fish & Richardson

[57] ABSTRACT

A component carrier includes a matrix of raised platforms on a space that support components with depending leads extending toward the base beside the raised platform and raised portions releasably support a cover plate formed with an opening that accommodates a tapered stud having an undercut portion for receiving a sliding lock attached to the cover plate. In one form the raised platforms are annular spacers. In another form the raised platforms are milled grooves transverse to the bar length.

4 Claims, 2 Drawing Sheets

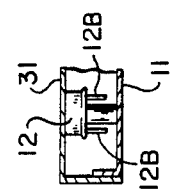
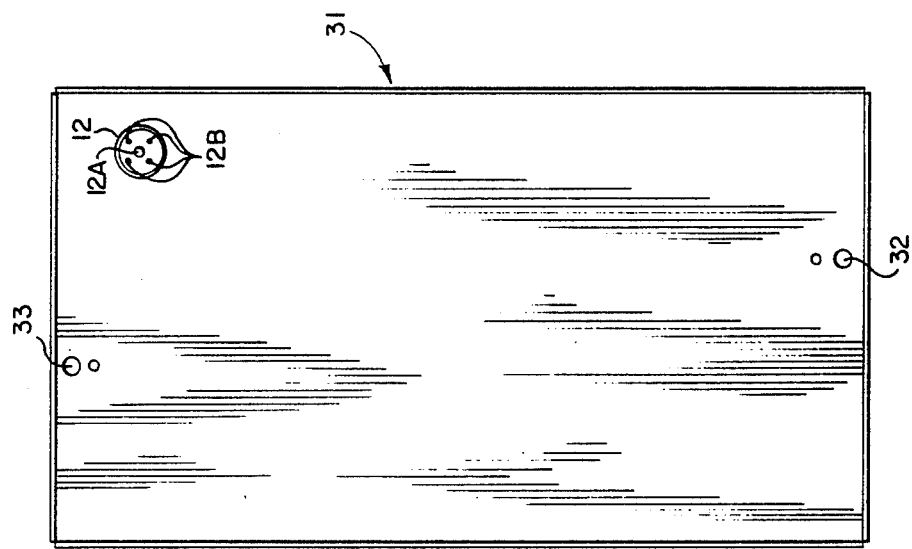
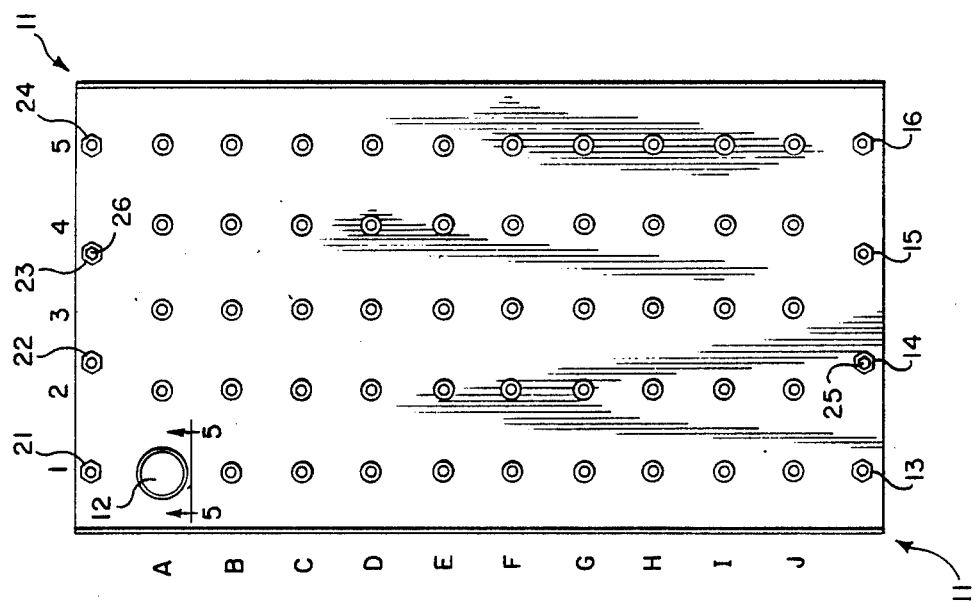

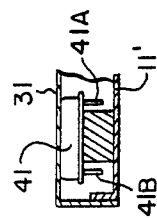
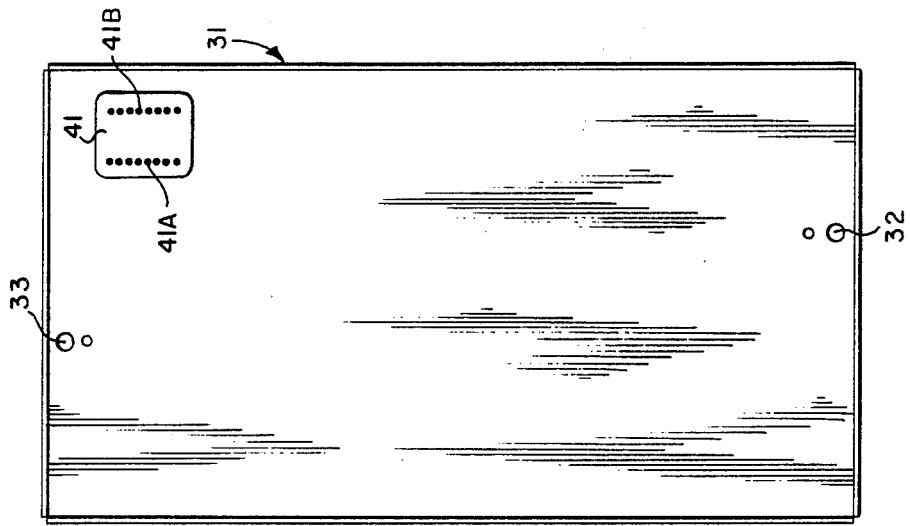
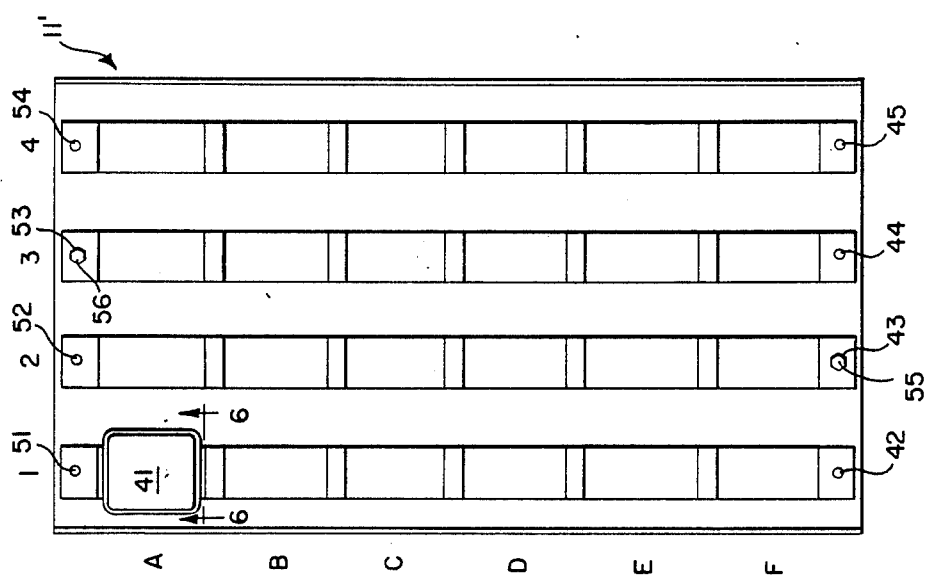

COMPONENT CARRYING APPARATUS AND METHOD

The present invention relates in general to component carrying and more particularly concerns novel apparatus and techniques for carrying a number of components to facilitate processing the components, such as in ovens and baths, while being able to distinguish among a number of like components and release them from being carried in a manner which preserves their positions and allows easy access to them for further processing, such as soldering or other activities.

It is often necessary to process a number of like components, such as semiconductor devices or circuits, such as passing the components through an oven or dipping them in a bath. It is also desirable to keep track of the individual components and facilitate removal from the carrier in a manner that allows easy further processing.

It is an important object of this invention to provide improved component carrying.

BRIEF SUMMARY OF THE INVENTION

According to the invention, there is a base plate having a matrix of component support platforms each uniquely located at the intersection of a row and column of the matrix. There is cover means for releasably engaging the tops of the components when seated on the platform to keep them in place on a respective platform during processing and, when inverted, support the components when the base plate is removed in corresponding positions as when supported by the respective platforms, but with leads upward and facilitating easy access for further processing or testing. According to one aspect of the invention, the platforms comprise annular spacers fastened to the bottom of the base plate, such as by riveting. According to another aspect of the invention, the platforms comprise recessed portions of a bar separated by upstanding walls, the distance between adjacent walls corresponding substantially to the length of a component, the width of a bar being slightly less than the distance between rows of leads of a component to be supported thereon, the height of each upstanding wall corresponding substantially to the height of the component to be supported on an adjacent platform.

Numerous other features, objects and advantages of the invention will become apparent from the following specification when read in connection with the accompanying drawing in which:

BRIEF DESCRIPTION OF THE DRAWING

FIG. 1 is a perspective view of a base plate with a matrix of annular sleeve platforms according to the invention;

FIG. 2 is a perspective view of the inside of the cover showing a component resting upon it inventered;

FIG. 3 is a perspective view of a base plate with a matrix of platforms formed in parallel bars with a component in place;

FIG. 4 is a perspective view of the underside of the cover plate inverted with a component resting upon it inverted;

FIG. 5 is a fragmentary sectional view through section 5—5 of FIG. 1 when covered; and FIG. 6 is a fragmentary sectional view through section 6—6 of FIG. 3 when covered.

DETAILED DESCRIPTION

With reference now to the drawing and more particularly FIG. 1 thereof, there is shown a perspective view of a base plate 11 having 50 component supporting platforms in a matrix of five columns designated 1-5 and ten rows designated A-J. Each support platform comprises an annular spacer, preferably made of stainless steel riveted to base plate 11. To better illustrate the structural arrangement of the carrier, only a single component 12 is shown in FIG. 1 seated on support platform A1. Component 12 typically has a depending threaded stud that resides in the opening of an annular support platform and depending leads spaced from the stud so that the annular support platform resides in the region between stud and leads. Each end of base plate 11 carries four tapped hexagonal posts 3-16 and 21-24 typically secured to the base plate by a machine screw at the bottom (not visible in FIG. 1). Hexagonal posts 14 and 23 carry undercut tapered studs 25 and 26, respectively, screwed into the threaded opening that passes through mating openings in the cover plate with the undercut portion receiving a sliding latch.

Referring to FIG. 2, there is shown a perspective view of cover plate 31 formed with openings 32 and 33 for receiving studs 25 and 26, respectively. Semiconductor component 12 is shown inverted with its central threaded stud 12A and four surrounding leads 12B in space quadrature.

The height of each support platform is slightly greater than the length of each of leads 12B. The annular width of each support platform is slightly less than the distance between stud 12A and each of leads 12B. The distance between the top of each support platform and cover plate 12 corresponds substantially to the distance between the top of a support platform and the top of component 12 when seated in the support platform. The height of posts 13-16 and 21-24 corresponds substantially to the distance between base plate 11 and the top of component 12 when seated on a support platform.

Referring to FIG. 3, there is shown another embodiment of the invention for carrying 24 rectangular circuit packages having a row of leads along each lengthwise edge. In this embodiment there are four bars forming columns 1-4, respectively, each bar milled to form six rectangular recesses in rows A-F for accommodating rectangular components, such as circuit package 41. The length of each recess corresponds substantially to the length of component 41. The width of each bar is slightly less than the separation between the rows of leads. The height of each recess corresponds substantially to the height of circuit package 41 above the support platform. Both ends of each bar forming columns 1-4 are formed with tapped openings 42-45 and 51-54 for receiving screws on the underside of base plate 11' (not visible) that secure the bars to base plate 11'. Openings 43 and 53 also receive threaded tapered studs 55 and 56 for accommodating cover 31. Circuit package 41 is shown seated on platform A1.

Referring to FIG. 4, there is shown cover 31 with openings 32 and 33 for accommodating studs 55 and 56, respectively. FIG. 4 also shows component 41 resting on the inside of cover 31 with base 11' removed and rows 41A and 41B of leads visible.

Referring to FIG. 5, there is shown a fragmentary sectional view through section 5—5 of FIG. 1 with cover 11 in place showing how component 12 is held in position by cover 31.

Referring to FIG. 6, there is shown a fragmentary sectional view through section 6—6 of FIG. 3 showing how circuit package 41 is held in place by cover 31.

The invention has a number of advantages. It firmly supports each component to be processed while enabling the respective components to be located and tracked during processing. Upon finishing processing, the closed package may be inverted, the base portion lifted from the cover portion, leaving the components inverted in the same relative positions as when inserted with leads upward, permitting easy and rapid acess to the components. The process according to the invention may thus comprise inserting the components upon the platforms, covering the supported components, processing the covered components, inverting the covered components, and lifting the base portion from cover portion to leave the components inverted resting on the inside of the cover portion.

It is evident that those skilled in the art may now make numerous uses and modifications of and departures from the specific embodiments described herein without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Apparatus for carrying components having leads comprising, a base plate, a matrix of supporting platforms on said base plate, each of said platforms being dimensioned to support a component in a region between the component leads with the component leads above said base plate, said base plate also carrying end support means for supporting cover means, said cover means being releasably supported on said end support means at a height above said platforms corresponding substantially to the distance between a platform and the top of a component supported thereon, whereby an assembly comprising said base plate, said matrix of platforms and said components supported thereon and said cover means may be inverted, said base plate removed from said cover means and said components rest on the inside of said cover means inverted with leads upstanding in substantially the same relationship to one another while supported on said matrix of platforms prior to inversion.

2. Component carrying apparatus in accordance with claim 1 wherein each of said platforms comprises an annular spacer formed with a central opening for accommodating a component stud, the radial width of the annular portion being slightly less than the distance between the component stud and leads surrounding it.

3. Component carrying apparatus in accordance with claim 1 wherein each of said platforms comprises a transverse groove formed in a bar with upstanding portions between adjacent platforms of height corresponding substantially to the height of the component above the platform when seated thereon.

4. A method of using the apparatus for carrying components having leads comprising, a base plate, a matrix of supporting platforms on said base plate, each of said platforms being dimensioned to support a component in a region between the component leads with the component leads above said base plate, said base plate also carrying end support means for supporting cover means, said cover means being releasably supported on said end support means at a height above said platforms corresponding substantially to the distance between a platform and the top of a component supported thereon, whereby an assembly comprising said base plate, said matrix of platforms and said componenst supported thereon and said cover means may be inverted, said base plate removed from said cover means and said components rest on the inside of said cover means inverted with leads upstanding in substantially the same relationship to one another while supported on said matrix of platforms prior to inversion, which method includes the steps of, placing a plurality of components each having depending leads on a respective one of said supporting platforms with a region thereof between the component leads resting on a respective platform, placing said cover means over the supported components and securing said cover means on said end support means, processing said components while thus being carried by said apparatus for carrying components having leads, inverting said apparatus for carrying components having leads so that said cover means rests upon a support, and removing said base plate from said cover means so that said components having leads each rest on the inside of said cover means with said depending leads extending upward.

* * * * *